United States Patent
Kim et al.

(10) Patent No.: US 11,700,731 B2
(45) Date of Patent: Jul. 11, 2023

(54) STACKED STRUCTURE FOR A VERTICAL MEMORY DEVICE

(71) Applicant: SAMSUNG ELECTRONICS CO., LTD., Suwon-si (KR)

(72) Inventors: Il-Woo Kim, Hwaseong-si (KR); Sang-Ho Rha, Seongnam-si (KR); Byoung-Deog Choi, Suwon-si (KR); Ik-Soo Kim, Yongin-si (KR); Min-Jae Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 17/347,652

(22) Filed: Jun. 15, 2021

(65) Prior Publication Data

US 2021/0313347 A1    Oct. 7, 2021

Related U.S. Application Data

(63) Continuation of application No. 16/454,499, filed on Jun. 27, 2019, now Pat. No. 11,063,060.

(30) Foreign Application Priority Data

Oct. 29, 2018    (KR) .................. 10-2018-0130092

(51) Int. Cl.
*H10B 43/27* (2023.01)
*H01L 21/28* (2006.01)
(Continued)

(52) U.S. Cl.
CPC ....... *H10B 43/27* (2023.02); *H01L 21/67178* (2013.01); *H01L 21/823487* (2013.01);
(Continued)

(58) Field of Classification Search
None
See application file for complete search history.

(56) References Cited

U.S. PATENT DOCUMENTS 7,094,362 B2    8/2006    Setlur et al.
9,768,192 B1    9/2017    Nakamura
(Continued)

FOREIGN PATENT DOCUMENTS

EP            3 486 951 A1    5/2019
WO    WO 2017/068859 A1    4/2017

*Primary Examiner* — Michelle Mandala
(74) *Attorney, Agent, or Firm* — Lee IP Law, P.C.

(57) ABSTRACT

A method of manufacturing a vertical memory device includes forming a first sacrificial layer on a substrate, the first sacrificial layer including a first insulating material, forming a mold including an insulation layer and a second sacrificial layer alternately and repeatedly stacked on the first sacrificial layer, the insulation layer and the second sacrificial layer including second and third insulating materials, respectively, different from the first insulating material, forming a channel through the mold and the first sacrificial layer, forming an opening through the mold and the first sacrificial layer to expose an upper surface of the substrate, removing the first sacrificial layer through the opening to form a first gap, forming a channel connecting pattern to fill the first gap, and replacing the second sacrificial layer with a gate electrode.

18 Claims, 20 Drawing Sheets

(51) Int. Cl.
    *H01L 21/67*       (2006.01)
    *H01L 21/8234*    (2006.01)
    *H10B 43/35*       (2023.01)

(52) U.S. Cl.
    CPC ........ *H01L 29/40117* (2019.08); *H10B 43/35* (2023.02); *H01L 2924/1438* (2013.01)

(56) References Cited

U.S. PATENT DOCUMENTS

| | | |
|---|---|---|
| 9,917,093 B2 | 3/2018 | Chu et al. |
| 9,917,100 B2 | 3/2018 | Zhang et al. |
| 9,929,174 B1 | 3/2018 | Mizutani et al. |
| 10,224,240 B1* | 3/2019 | Funayama .......... H01L 27/1157 |
| 2016/0351576 A1 | 12/2016 | Yamazaki et al. |
| 2017/0110468 A1 | 4/2017 | Shim et al. |
| 2017/0117290 A1 | 4/2017 | Lee et al. |
| 2018/0053780 A1 | 2/2018 | Oh et al. |
| 2018/0308854 A1 | 10/2018 | Miyata |
| 2020/0098772 A1* | 3/2020 | Wang .................. H01L 21/0217 |

* cited by examiner

1ST DIRECTION
2ND DIRECTION
3RD DIRECTION

1ST DIRECTION
2ND DIRECTION
3RD DIRECTION

STACKED STRUCTURE FOR A VERTICAL MEMORY DEVICE

CROSS-REFERENCE TO RELATED APPLICATION

The present application is a continuation of U.S. patent application Ser. No. 16/454,499 filed Jun. 27, 2019, which is incorporated by reference herein in its entirety.

Korean Patent Application No. 10-2018-0130092, filed on Oct. 29, 2018, in the Korean Intellectual Property Office, and entitled: "Methods of Manufacturing a Vertical Memory Device," is incorporated by reference herein in its entirety.

BACKGROUND

1. Field

Embodiments relate to a method of manufacturing a vertical memory device.

2. Description of the Related Art

During fabrication of a VNAND flash memory device, in order to connect channels to a substrate, channel holes may be formed through mold to expose an upper surface of the substrate, a selective epitaxial growth (SEG) process may be performed using the exposed upper surface of the substrate as a seed to form semiconductor patterns, and channels may be formed on the semiconductor patterns. However, characteristics of the semiconductor patterns may have distribution according to heights thereof. Additionally, in a COP structure, in which circuit patterns are formed under a memory cell array, the SEG process may be performed using a polysilicon layer over the circuit patterns, and thus, forming the semiconductor patterns having uniform characteristics is not easy.

SUMMARY

According to an aspect of embodiments, there is provided a method of manufacturing a vertical memory device. In the method, a first sacrificial layer including a first insulating material may be formed on a substrate. A mold including an insulation layer and a second sacrificial layer including second and third insulating materials, respectively, different from the first insulating material that are alternately and repeatedly stacked on the first sacrificial layer may be formed. A channel may be formed through the mold and the first sacrificial layer. An opening may be formed through the mold and the first sacrificial layer to expose an upper surface of the substrate. The first sacrificial layer may be removed through the opening to form a first gap. A channel connecting pattern may be formed to fill the first gap. The second sacrificial layer may be replaced with a gate electrode.

According to an aspect of embodiments, there is provided a method of manufacturing a vertical memory device. In the method, a first sacrificial layer may be formed on a substrate. A mold including an insulation layer and a second sacrificial layer alternately and repeatedly stacked may be formed on the first sacrificial layer. A channel may be formed through the mold and the first sacrificial layer. An opening may be formed through the mold and the first sacrificial layer to expose an upper surface of the substrate. The first sacrificial layer may be formed through the opening to form a gap. A channel connecting pattern may be formed to fill the gap. The second sacrificial layer may be replaced with a gate electrode. An etching selectivity of the first sacrificial layer with respect to the insulation layer may be greater than an etching selectivity of the second sacrificial layer with respect to the insulation layer.

According to an aspect of embodiments, there is provided a method of manufacturing a vertical memory device. In the method, a first sacrificial layer including a first oxide may be formed on a substrate. A mold including an insulation layer and a second sacrificial layer including a second oxide and a nitride, respectively, that are alternately and repeatedly stacked may be formed on the first sacrificial layer. A channel may be formed through the mold and the first sacrificial layer. An opening may be formed through the mold and the first sacrificial layer to expose an upper surface of the substrate. The first sacrificial layer may be formed through the opening to form a gap. A channel connecting pattern may be formed to fill the gap. The second sacrificial layer may be replaced with a gate electrode.

According to an aspect of embodiments, there is provided a method of manufacturing a vertical memory device. In the method, a circuit pattern may be formed on a substrate. A base pattern may be formed on the circuit pattern. A first sacrificial layer including a first insulating material may be formed on a substrate. A mold including an insulation layer and a second sacrificial layer including second and third insulating materials, respectively, different from the first insulating material that are alternately and repeatedly stacked may be formed on the first sacrificial layer. A channel may be formed through the mold and the first sacrificial layer. An opening may be formed through the mold and the first sacrificial layer to expose an upper surface of the substrate. The first sacrificial layer may be formed through the opening to form a first gap. A channel connecting pattern may be formed to fill the first gap. The second sacrificial layer may be replaced with a gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

The above and other aspects and features of the vertical memory devices and the methods of manufacturing the same in accordance with example embodiments will become readily understood from detail descriptions that follow, with reference to the accompanying drawings. Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other.

FIGS. 1 to 16 are plan views and cross-sectional views illustrating stages in a method of manufacturing a vertical memory device in accordance with example embodiments. Particularly, FIGS. 1, 4, 7 and 15 are the plan views, and FIGS. 2-3, 5-6, 8-14 and 16 are cross-sectional views taken along lines A-A', respectively, of corresponding plan views.

Figure 1:
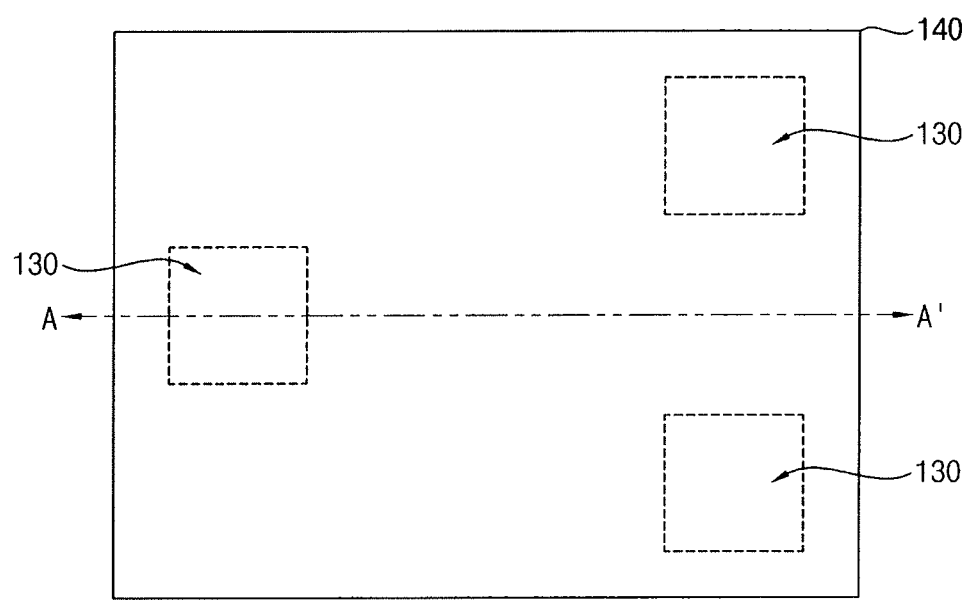
FIGS. 1 to 16 illustrate plan views and cross-sectional views of stages in a method of manufacturing a vertical memory device in accordance with example embodiments.
Figure 1:
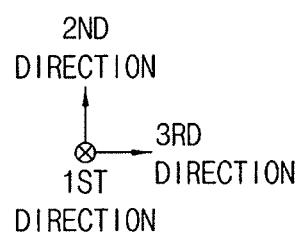
Figure 2:
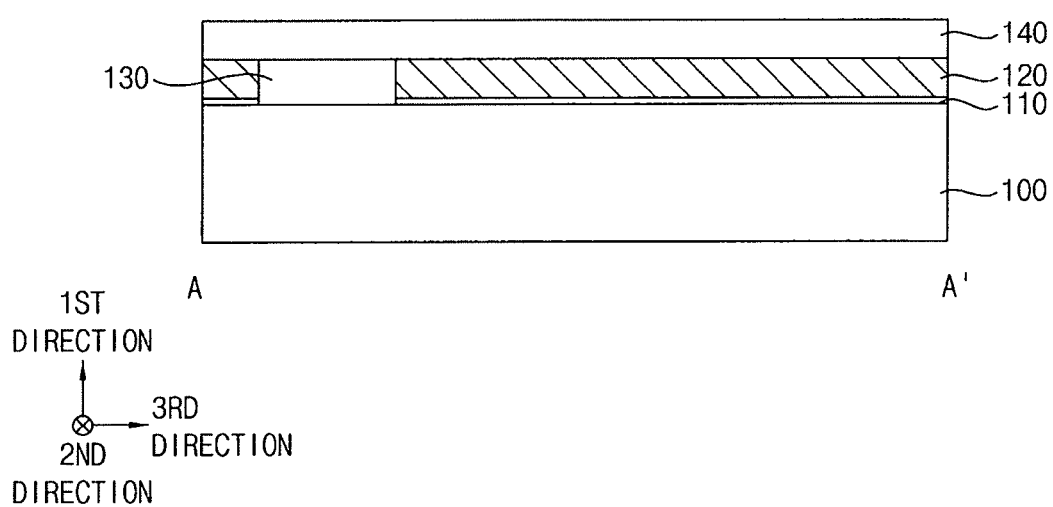

Referring to FIGS. 1 and 2, a pad layer 110 and a first sacrificial layer 120 may be sequentially stacked on a substrate 100. Then, the pad layer 110 and the first sacrificial layer 120 may be partially removed from the substrate 100 to form a support pattern 130 on the substrate 100. A support layer 140 may be formed on, e.g., to cover, the first sacrificial layer 120 and the support pattern 130.

The substrate 100 may include, e.g., silicon, germanium, silicon-germanium or a III-V compound such as GaP, GaAs, GaSb, etc. In some embodiments, the substrate 100 may be, e.g., a silicon-on-insulator (SOI) substrate or a germanium-on-insulator (GOI) substrate.

The pad layer 110 may include an oxide, e.g., silicon oxide.

The first sacrificial layer 120 may include a material different from those of an insulation layer 160 and a second sacrificial layer 170 that will be described later. In example embodiments, the first sacrificial layer 120 may include a material having an etching selectivity with respect to an oxide and a nitride included in the insulation layer 160 and the second sacrificial layer 170, respectively. Thus, the first sacrificial layer 120 may include, e.g., germanium oxide ($GeO_2$) or silicon oxide doped with germanium (Ge-doped $SiO_2$).

When the first sacrificial layer 120 includes germanium oxide ($GeO_2$), a first etching ratio of the first sacrificial layer 120 with respect to the insulation layer 160 including, e.g., silicon oxide ($SiO_2$), may be greater than a second etching ratio of the second sacrificial layer 170 including, e.g., silicon nitride, with respect to the insulation layer 160.

In example embodiments, the support pattern 130 and the support layer 140 may include a material having an etching selectivity with respect to the first sacrificial layer 120. For example, the support pattern 130 and the support layer 140 may include undoped polysilicon.

The support pattern 130 may be formed by removing portions of the pad layer 110 and the first sacrificial layer 120 to form a first opening therethrough, and, e.g., completely, filling the first opening. Thus, an upper surface of the support pattern 130 may have a height substantially coplanar with an upper surface of a structure including the pad layer 110 and the first sacrificial layer 120, and a sidewall of the support pattern 130 may contact sidewalls of the pad layer 110 and the first sacrificial layer 120. For example, as illustrated in FIG. 2, upper surfaces of the support pattern 130 and the first sacrificial layer 120 may be coplanar.

The support pattern 130 may overlap an area at which a second opening 290 may be formed, as will be described in detail with reference to FIGS. 7 and 8. Thus, in accordance with the configuration of the second opening 290 (and as illustrated in FIG. 1), one or a plurality of support patterns 130 may be formed in the second direction, and a plurality of support patterns 130 may be formed in the third direction.

Figure 3:
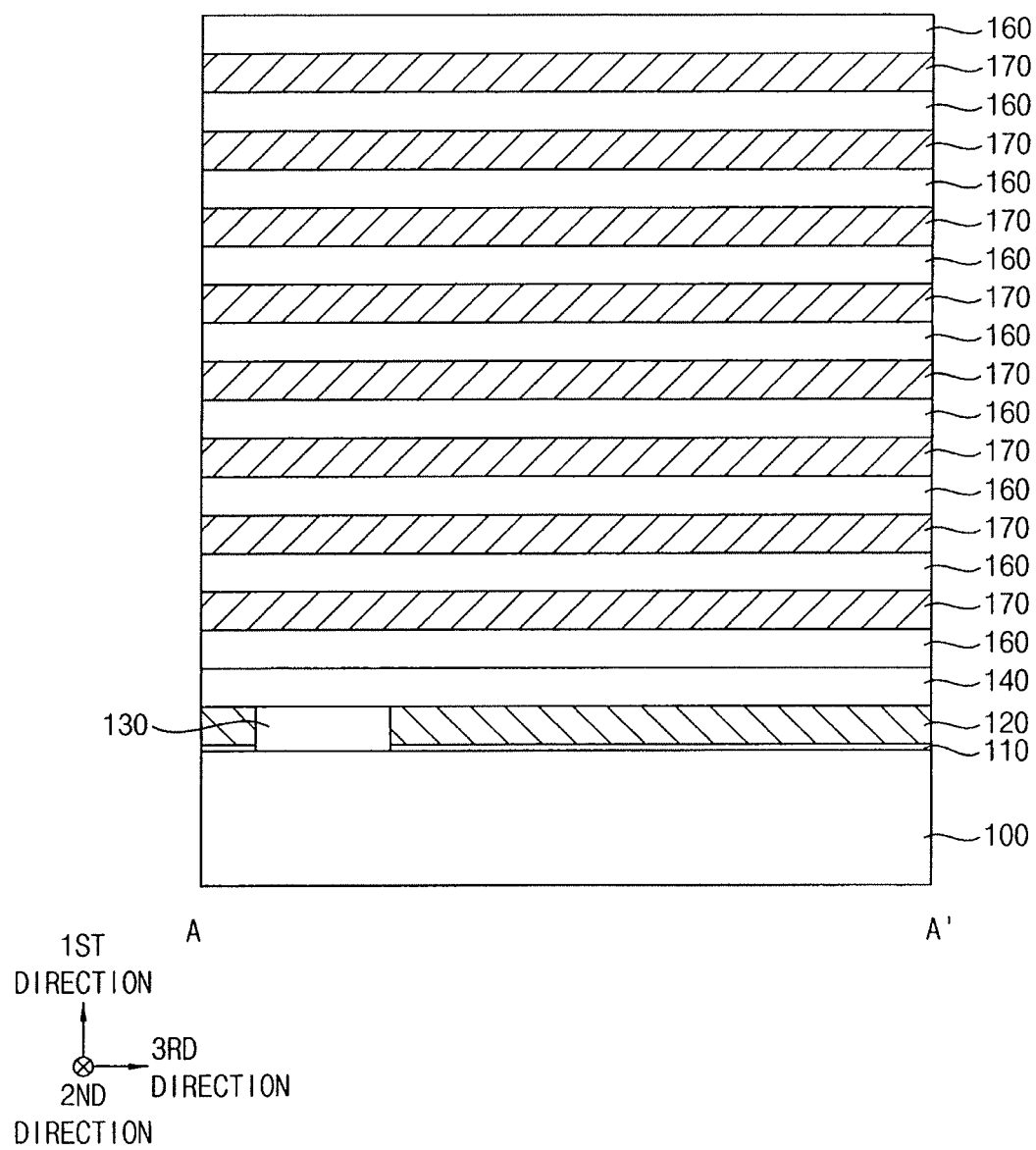

Referring to FIG. 3, the insulation layer 160 and the second sacrificial layer 170 may be alternately and repeatedly formed on the support layer 140 to form a mold. In example embodiments, the insulation layer 160 may include an oxide, e.g., silicon oxide, and the second sacrificial layer 170 may include a material having an etching selectivity with respect to the insulation layer 160, e.g., a nitride such as silicon nitride. The insulation layer 160 and the second sacrificial layer 170 may be formed by, e.g., a chemical vapor deposition (CVD) process, a plasma enhanced chemical vapor deposition (PECVD) process, an atomic layer deposition (ALD) process, etc.

Figure 4:
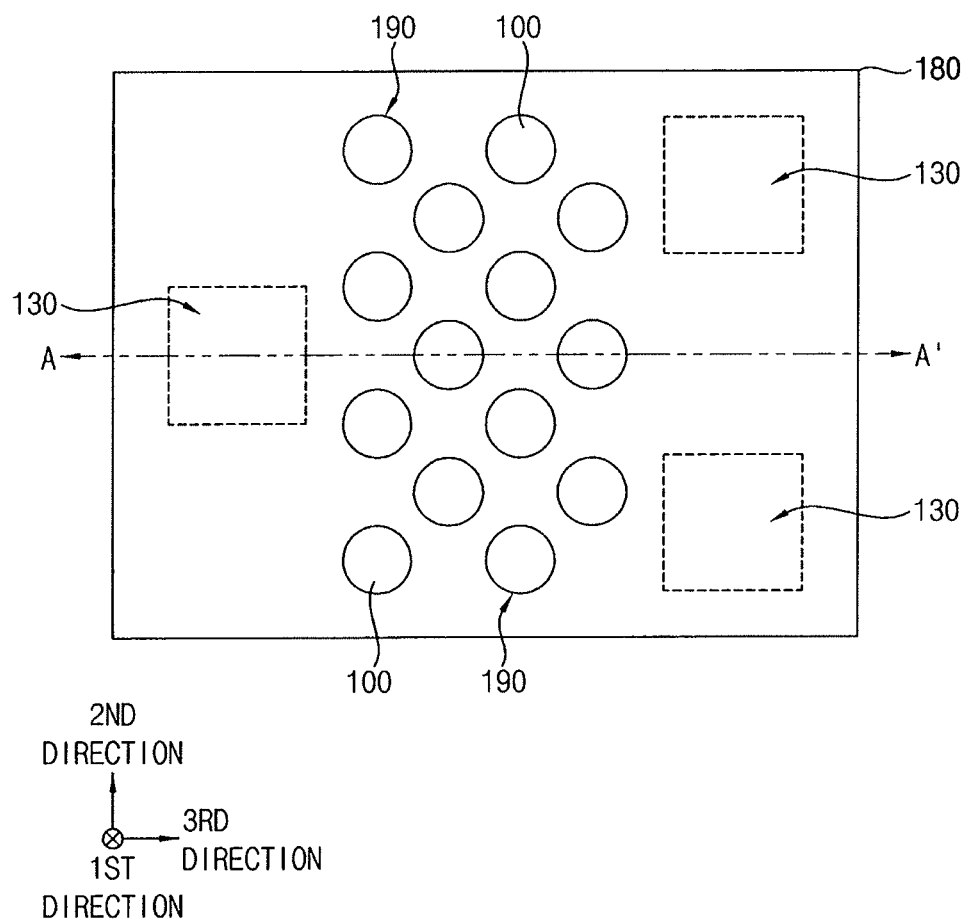
Figure 5:
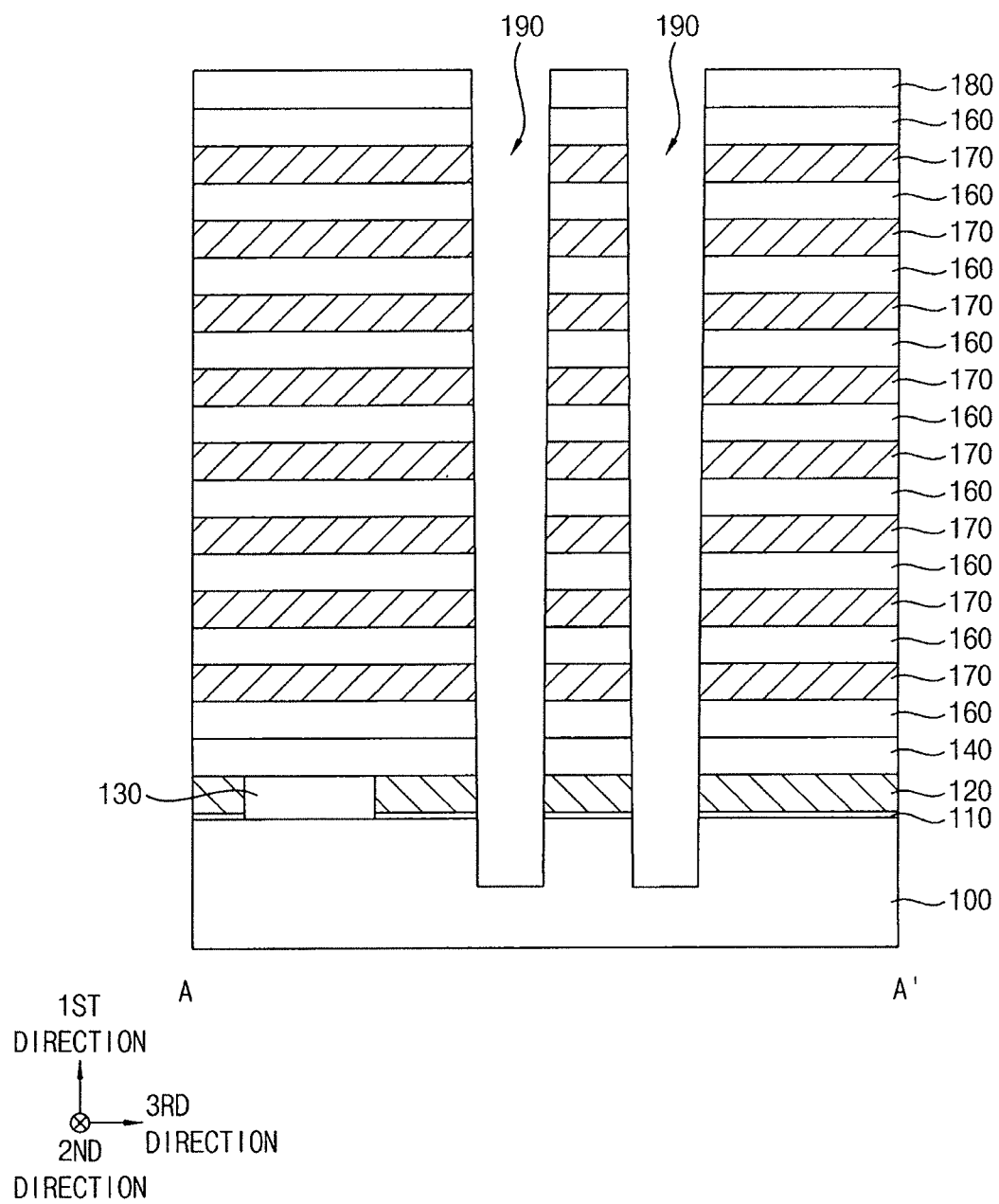

Referring to FIGS. 4 and 5, a first insulating interlayer 180 may be formed on an uppermost one of the insulation layers 160, and a channel hole 190 may be formed through the first insulating interlayer 180, the mold, the support layer 140, the first sacrificial layer 120 and the pad layer 110 by a dry etching process. The first insulating interlayer 180 may include an oxide, e.g., silicon oxide.

In example embodiments, the dry etching process may be performed until an upper surface of the substrate 100 is exposed, and an upper portion of the substrate 100 may be further removed in the dry etching process. In example embodiments, the dry etching process may be performed to form a plurality of channel holes 190 in each of the second and third directions, and thus a channel hole array may be defined.

Figure 6:
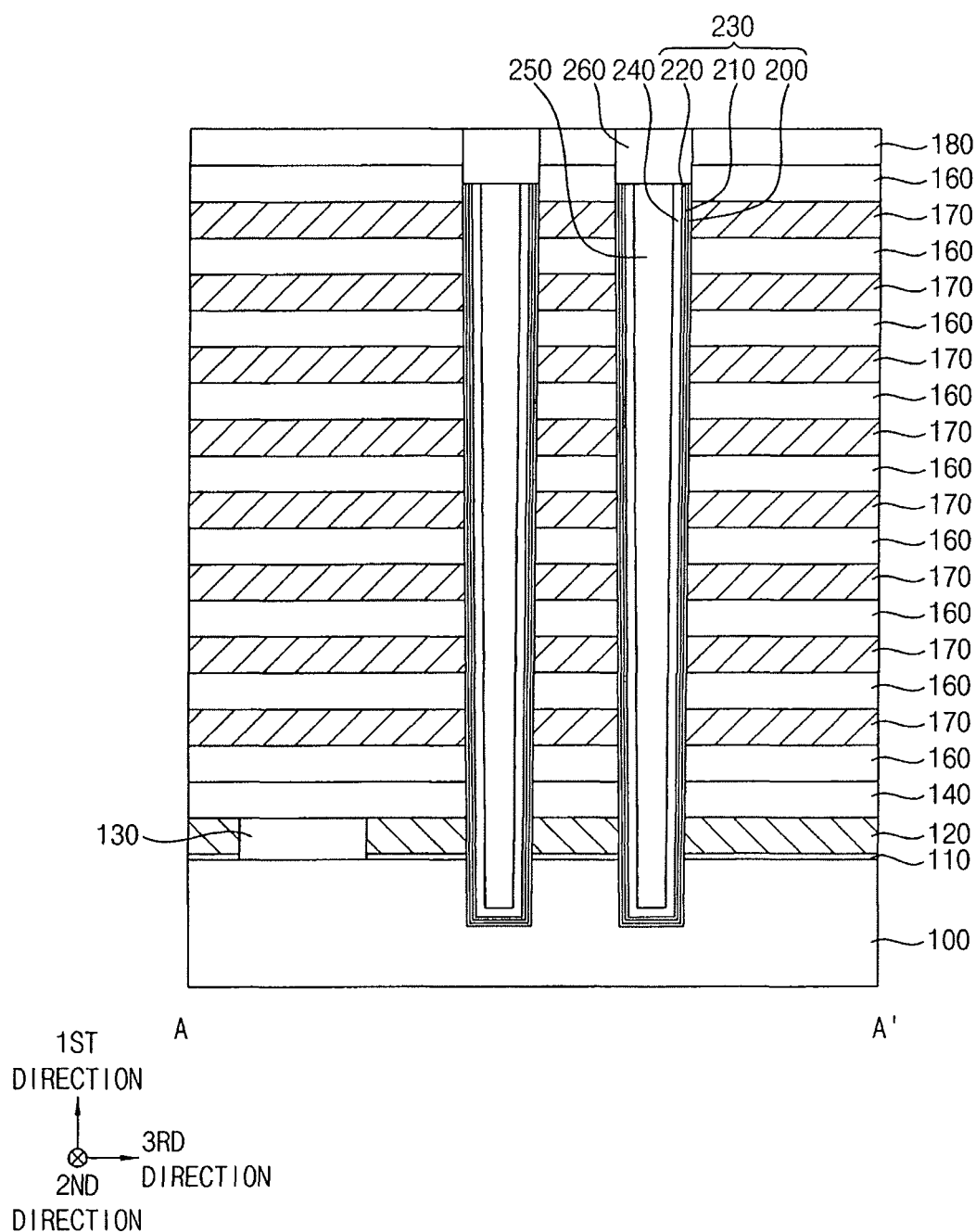

Referring to FIG. 6, a charge storage structure 230, a channel 240, a filling pattern 250, and a capping pattern 260 may be formed in the channel hole 190.

For example, a charge storage structure layer and a channel layer may be sequentially formed on a sidewall of the channel hole 190, the exposed upper surface of the substrate 100, and an upper surface of the first insulating interlayer 180. A filling layer may be formed on the channel layer to fill a remaining portion of the channel hole 190, and the filling layer, the channel layer, and the charge storage structure layer may be planarized until the upper surface of the first insulating interlayer 180 is exposed.

In example embodiments, the planarization process may include a chemical mechanical polishing (CMP) process and/or an etch back process. By the planarization process, the charge storage structure 230 and the channel 240 sequentially stacked on the sidewall of the channel hole 190 and the upper surface of the substrate 100 may be formed, and the filling pattern 250 may fill an inner space formed by the channel 240.

As the channel hole 190, in which the channel 240 is formed, may define the channel hole array, the channel 240 in the channel hole 190 may also define a channel array.

In example embodiments, the charge storage structure 230 may include a first blocking pattern 200, a charge storage pattern 210, and a tunnel insulation pattern 220 sequentially stacked. For example, the first blocking pattern 200, the charge storage pattern 210, and the tunnel insulation pattern 220 may include silicon oxide, silicon nitride, and silicon oxide, respectively.

Upper portions of the filling pattern 250, the channel 240, and the charge storage structure 230 may be removed to form a recess. A capping layer may be formed on the first insulating interlayer 180 to fill the recess, and the capping layer may be planarized until the upper surface of the first insulating interlayer 180 may be exposed to form a capping pattern 260.

Figure 7:
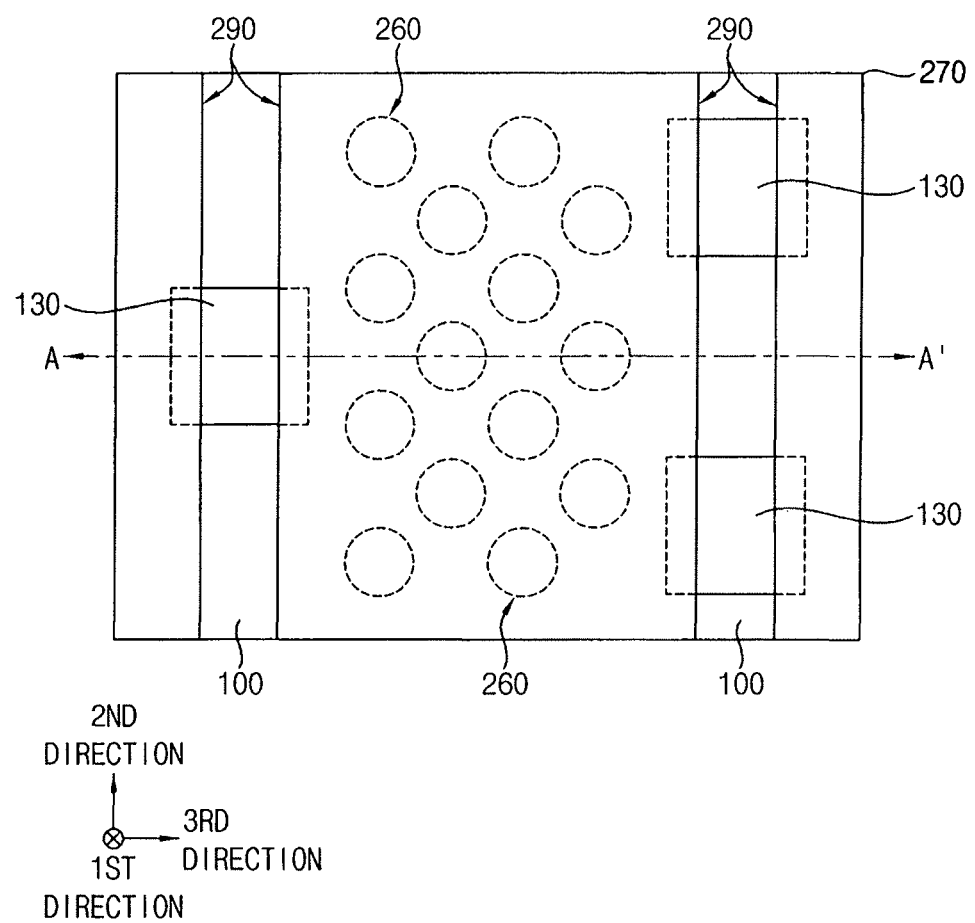
Figure 8:
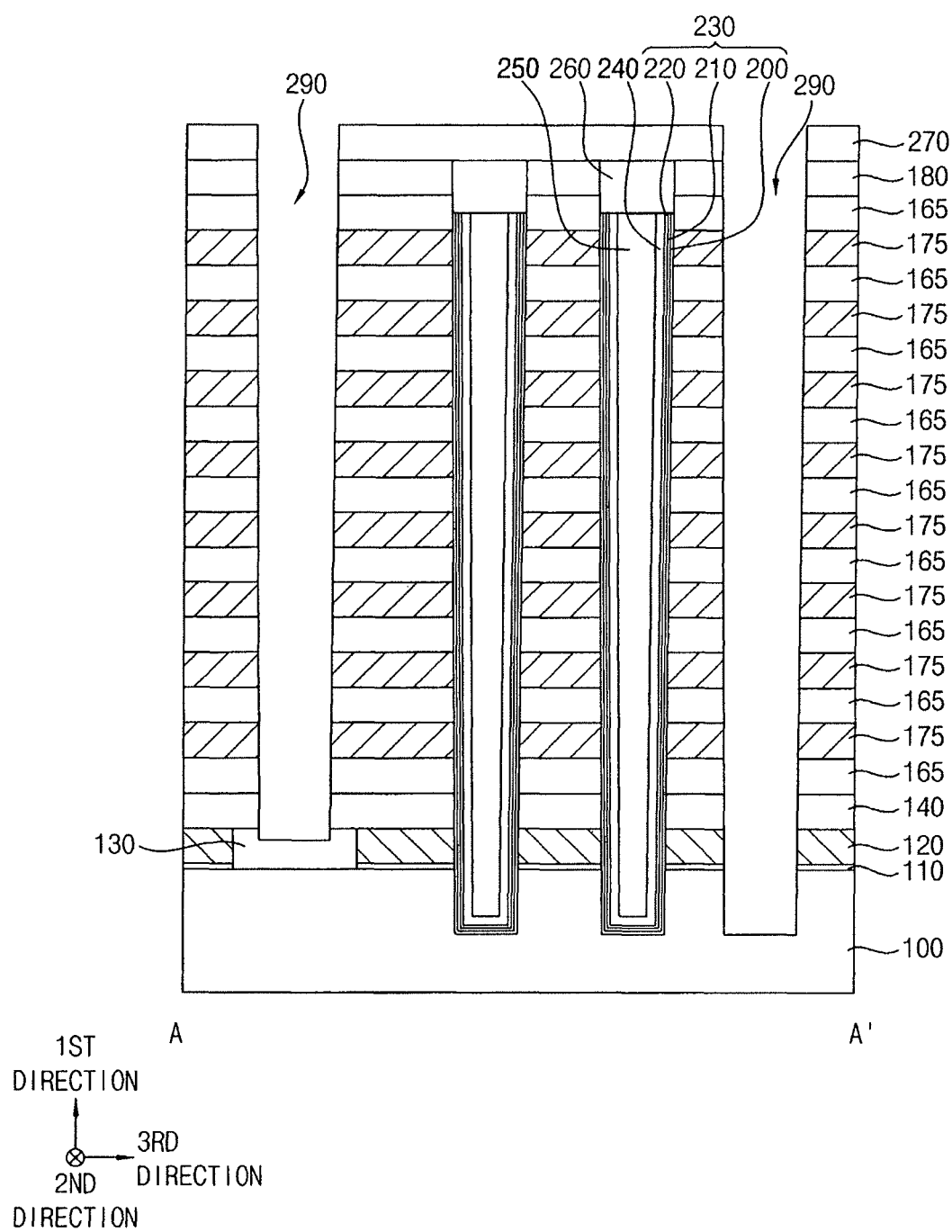

Referring to FIGS. 7 and 8, a second insulating interlayer 270 may be formed on the first insulating interlayer 180 and the capping pattern 260, and the second opening 290 may be formed through the first and second insulating interlayers 180 and 270, the mold, the support layer 140, the first sacrificial layer 120, and the pad layer 110 by a dry etching process. As illustrated in FIG. 7, a plurality of channel holes (indicated by the capping patterns 260 therein) may be arranged between two adjacent second openings 290.

In example embodiments, the dry etching process may be performed until the upper surface of the substrate 100 is exposed, and an upper surface of the support pattern 130 may be also exposed. Additionally, upper portions of the substrate 100 and the support pattern 130 may be also removed during the dry etching process. As the second opening 290 is formed, the first sacrificial layer 120, and the insulation layer 160 and the second sacrificial layer 170 of the mold may be exposed.

In example embodiments, the second opening 290 may extend in the second direction, e.g., to have a longitudinal direction in the second direction in a plan view, and a plurality of second openings 290 may be formed in the third direction, e.g., to be spaced apart from each other in the third direction. As discussed previously, the second opening 290 may overlap one support pattern 130 or a plurality of support patterns 130 in a plan view. As the second opening 290 is formed, the insulation layer 160 may be transformed into an insulation pattern 165 extending in the second direction, and the second sacrificial layer 170 may be transformed into a second sacrificial pattern 175 extending in the second direction.

Figure 9:
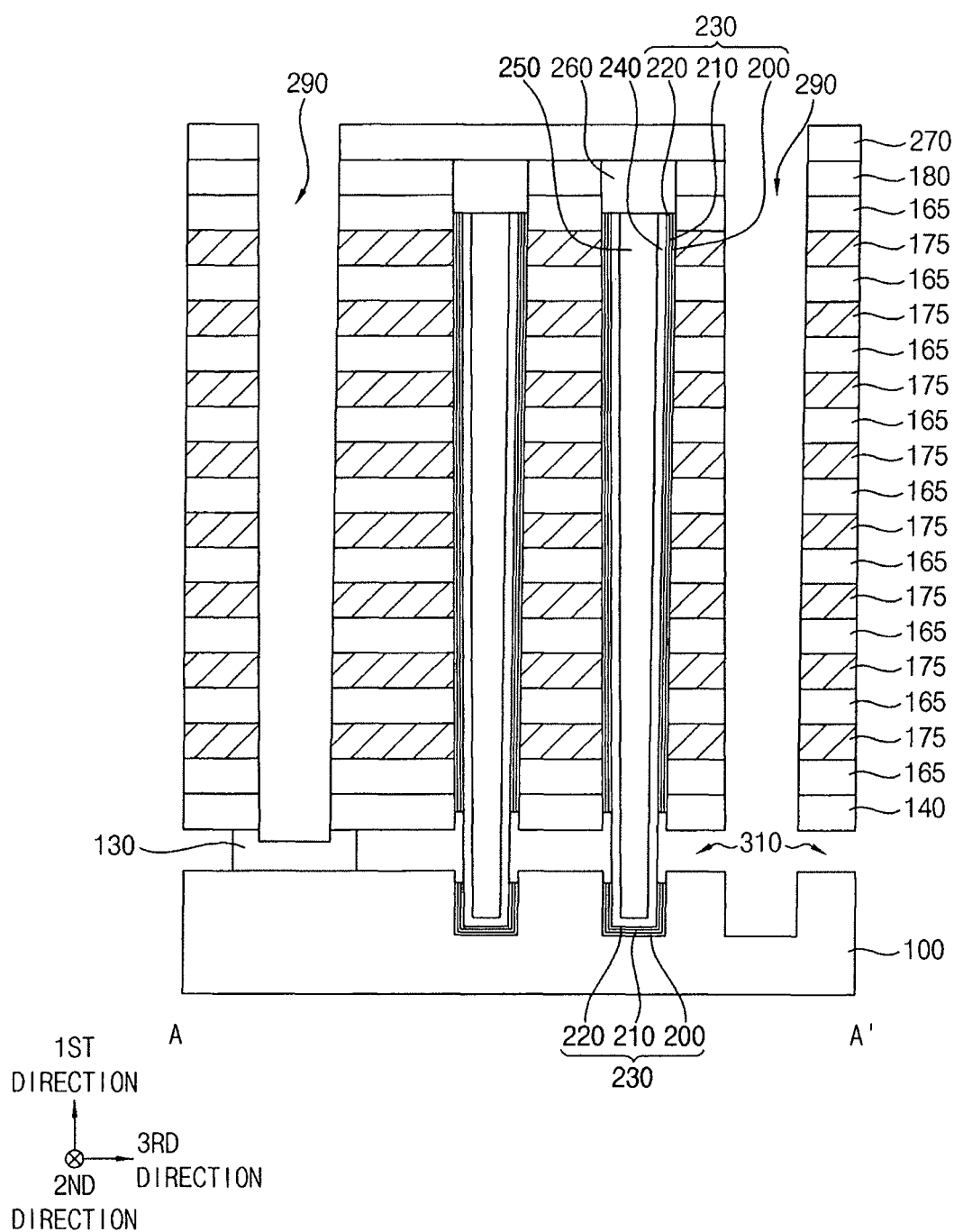

Referring to FIG. 9, the first sacrificial layer 120 exposed by the second opening 290 may be removed to form a first gap 310. Thus, a sidewall of the support pattern 130 and a portion of a sidewall of the charge storage structure 230 may be exposed by the first gap 310.

In example embodiments, the first sacrificial layer 120 may be removed by a wet etching process using a solution including SC1. The first sacrificial layer 120 may include a material having a high etching selectivity with respect to the insulation pattern 165 and the second sacrificial pattern 175 of the mold, and thus, the exposed portion of the mold may not be damaged during the wet etching process. That is, due to the high etching selectivity of the first sacrificial layer 120 with respect to the insulation pattern 165 and the second sacrificial pattern 175 of the mold, even though the insulation pattern 165 and the second sacrificial pattern 175 of the mold are, e.g., directly, exposed to the interior of the opening during removal of the first sacrificial layer 120, the insulation pattern 165 and the second sacrificial pattern 175 of the mold are not damaged. Accordingly, the first sacrificial layer 120 may be easily removed with no etch stop pattern on a sidewall of the second opening 290.

For example, germanium oxide ($GeO_2$) included in the first sacrificial layer 120 may have a high etching selectivity with respect to silicon oxide ($SiO_2$) included in the insulation pattern 165. The etching selectivity ratio of the first sacrificial layer 120 including germanium oxide ($GeO_2$) with respect to silicon oxide ($SiO_2$) may be greater than that of a sacrificial layer including silicon nitride with respect to silicon oxide ($SiO_2$). Thus, the insulation pattern 165 of the mold (which includes silicon oxide) may not be damaged during the wet etching process of the first sacrificial layer 120 (which includes germanium oxide) even with no etch stop pattern, e.g., due to the high etching selectivity ratio.

Additionally, the first sacrificial layer 120 may include an oxide instead of a nitride, and thus a carbon-nitrogen (C—N) residue, which could have been generated if the first sacrificial layer 120 were to include a nitride, may not be generated. Accordingly, the characteristics of neighboring layer structures, e.g., the channels 240, may not be degraded due to the carbon-nitrogen (C—N) residue.

In example embodiments, when the first gap 310 is formed by the wet etching process, the mold may not collapse as it supported by the support pattern 130 and the support layer 140. For example, as illustrated in FIG. 9, a width of the support pattern 130 in the third direction may be larger than a width of the second opening 290 in the third direction, so portions of the support pattern 130 may be in contact with a bottom of the support layer 140 around a bottom of the second opening 290, e.g., the support pattern 130 may extend from the substrate 100 to the support layer 140 while surrounding the bottom of the second opening 290.

The portion of the charge storage structure 230 exposed by the first gap 310 may be removed to expose an outer sidewall of the channel 240 covered by the charge storage structure 230. The pad layer 110 on the substrate 100 may be also removed.

The exposed portion of the charge storage structure 230 may be removed by, e.g., a wet etching process. The charge storage structure 230 and the pad layer 110 may have a thin thickness, and thus, when the wet etching process is performed, other layer structures, e.g., the insulation pattern 165 and the second sacrificial pattern 175 of the mold, may not be damaged.

The wet etching process may have isotropic characteristic, and thus not only the portion of the charge storage structure 230 exposed by the first gap 310 but also a portion of the charge storage structure 230 contacting a sidewall of the support layer 140 facing the outer sidewall of the channel 240 may be partially removed. However, a portion of the charge storage structure 230 contacting an upper sidewall of the support layer 140 and a portion of the charge storage structure 230, which may be adjacent the sidewall of the support layer 140 and contact the channel 240, may remain. By the wet etching process, a portion of the charge storage structure 230 penetrating through an upper portion of the substrate 100 may be divided from a portion thereof penetrating through the mold.

Figure 10:
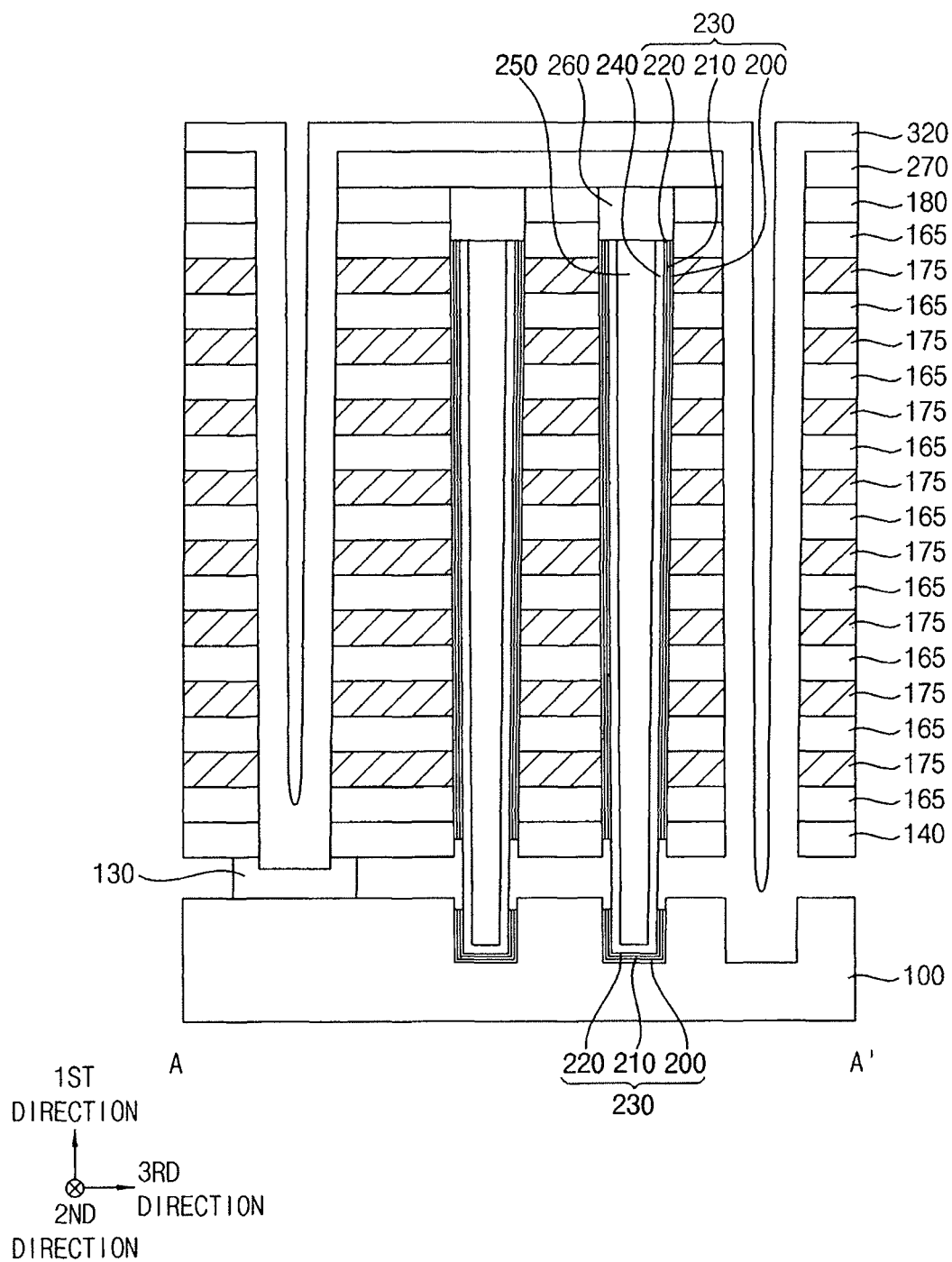

Referring to FIG. 10, a channel connecting layer 320 may be formed to fill the first gap 310. The channel connecting layer 320 may fill the first gap 310, and further be formed on a sidewall and a bottom of the second opening 290 and an upper surface of the second insulating interlayer 270. The channel connecting layer 320 may include, e.g., polysilicon doped with n-type impurities.

Figure 11:
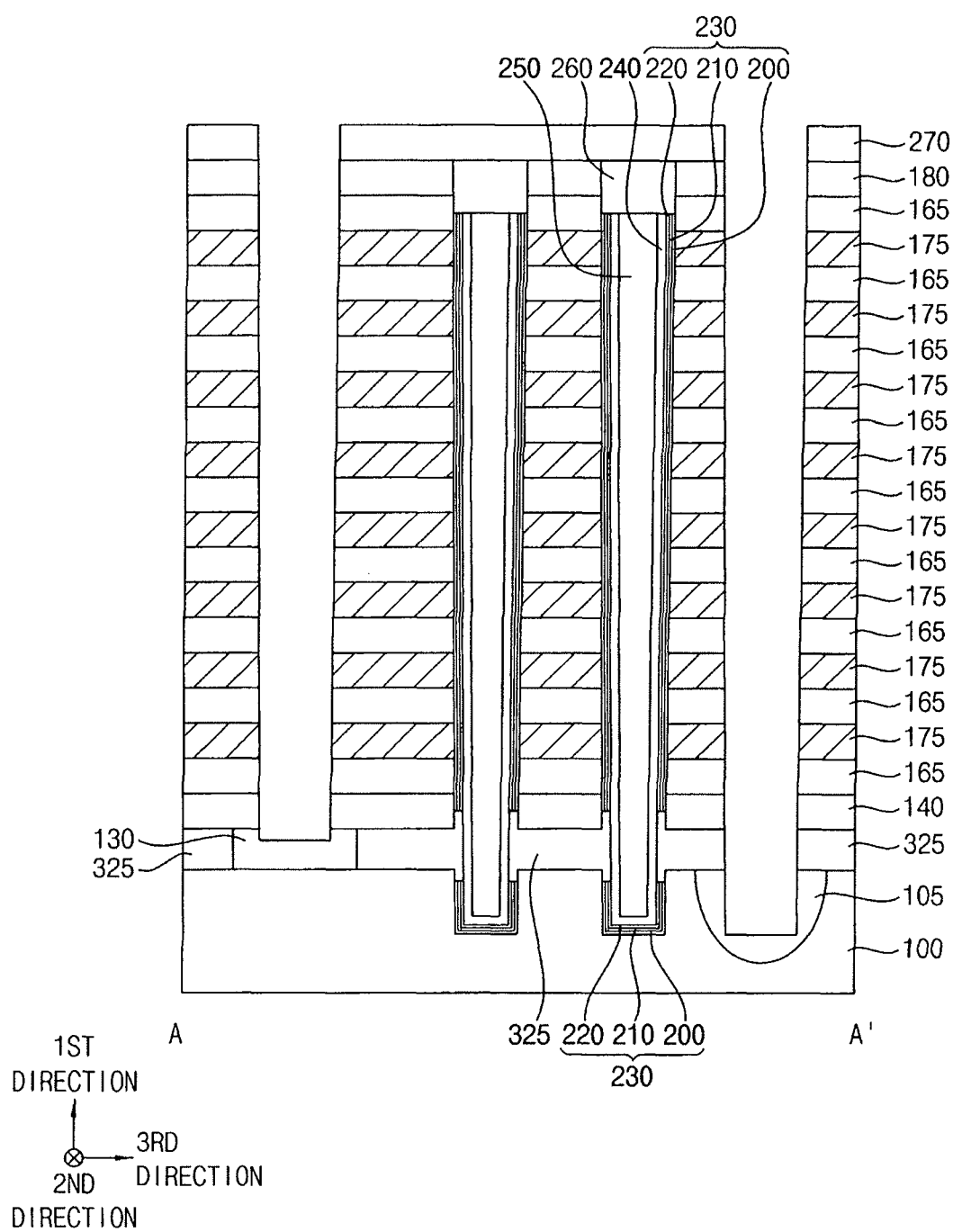

Referring to FIG. 11, the channel connecting layer 320 may be partially removed to form a channel connecting pattern 325 only in the first gap 310. In example embodiments, the channel connecting pattern 325 may be formed by removing a portion of the channel connecting layer 320 in the second opening 290 through an etch back process, e.g., the channel connecting layer 320 may be completely removed from the second opening. As the channel connecting pattern 325 is formed, the channels 240 forming the channel array may relate to each other via the channel connecting pattern 325.

Impurities may be implanted into an upper portion of the substrate 100 exposed by the second opening 290 to form an impurity region 105. In example embodiments, the impurity region 105 may contact a lower surface of the channel connecting pattern 325, and thus may be electrically connected to the channel connecting pattern 325 including doped polysilicon.

Figure 12:
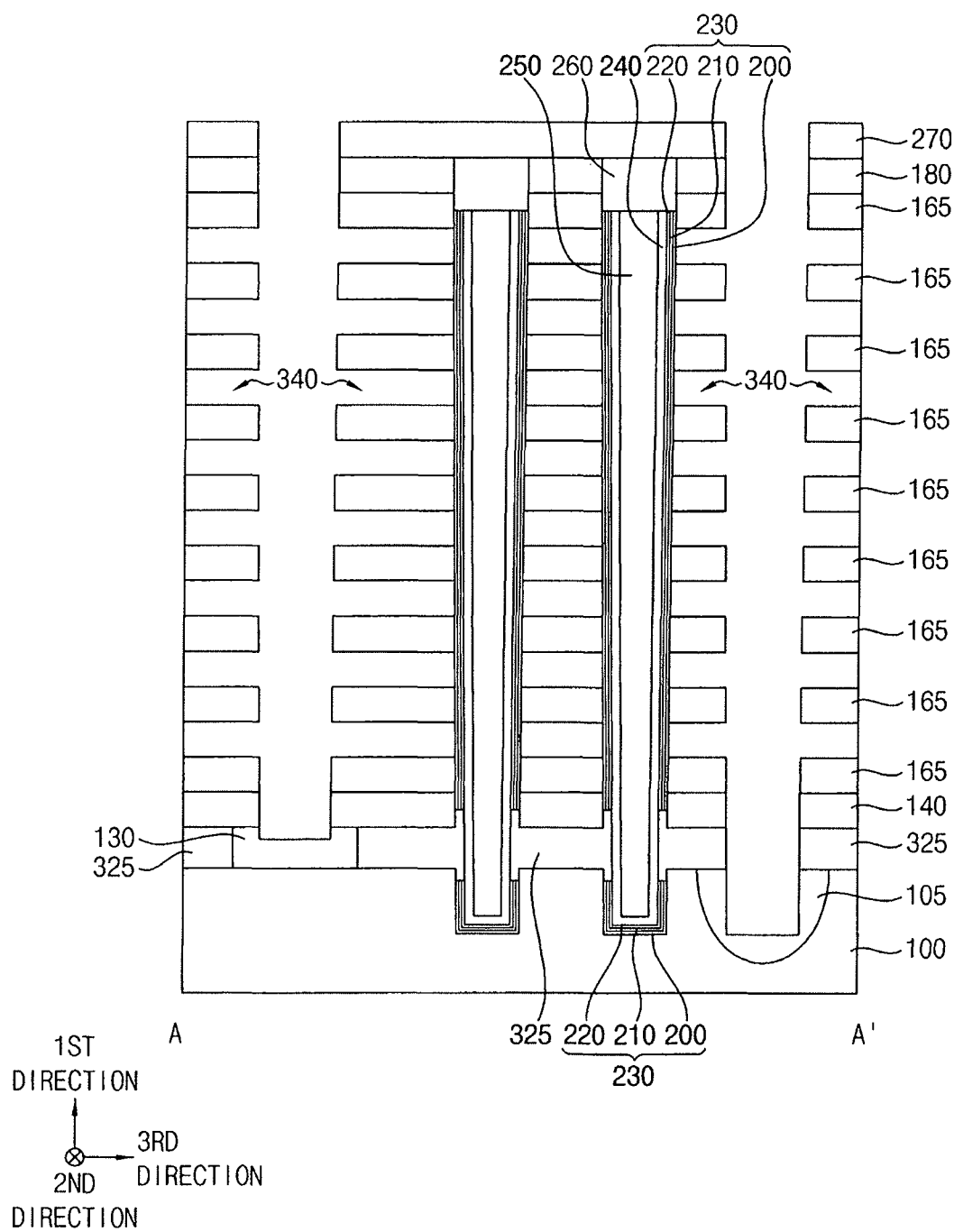

Referring to FIG. 12, the second sacrificial patterns 175 exposed by the second opening 290 may be removed to form a second gap 340 between the insulation patterns 165 at a plurality of levels, and an outer sidewall of the first blocking pattern 200 may be partially exposed by the second gap 340. In example embodiments, the second sacrificial patterns 175 may be removed by a wet etching process using an etching solution including phosphoric acid or sulfuric acid.

Figure 13:
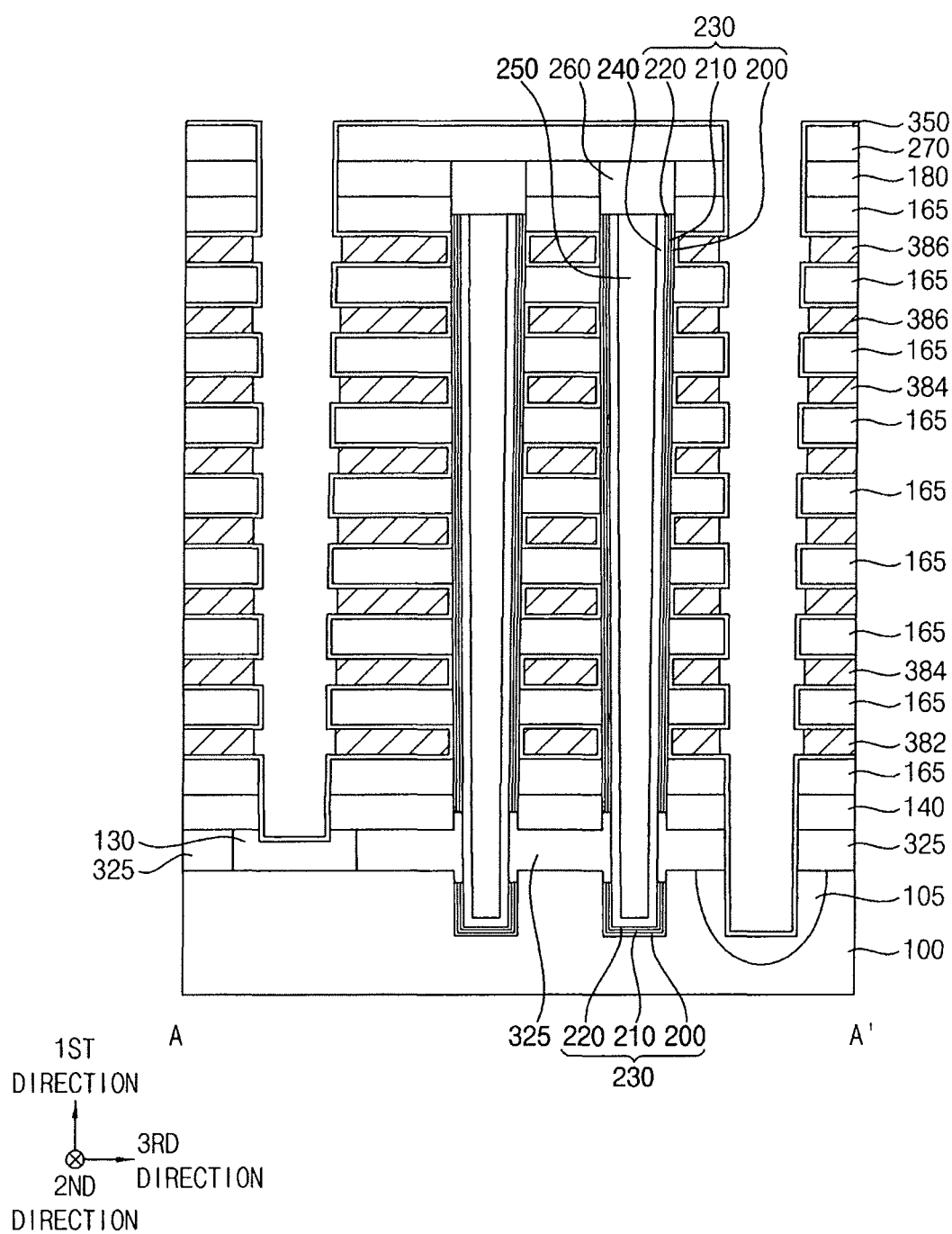

Referring to FIG. 13, a second blocking pattern 350 may be formed on the exposed outer sidewall of the first blocking pattern 200, inner walls of the second gaps 340, surfaces of the insulation patterns 165, the upper surface of the substrate 100, an upper surface of the support pattern 130, and the upper surface of the second insulating interlayer 270. A gate electrode layer may be formed on the second blocking pattern 350.

The gate electrode layer may include a gate barrier layer and a gate conductive layer sequentially stacked. The gate electrode layer may include a low resistance metal, e.g., tungsten, titanium, tantalum, platinum, etc., and the gate barrier layer may include a metal nitride, e.g., titanium nitride, tantalum nitride, etc.

The gate electrode layer may be partially removed to form a gate electrode in each of the second gaps 340. In example embodiments, the gate electrode layer may be partially removed by a wet etching process, and thus the gate electrode may entirely or partially fill each of the second gaps 340.

The gate electrode may extend in the second direction, and a plurality of gate electrodes may be formed in the third direction. That is, the gate electrodes each of which may extend in the second direction may be spaced apart from each other by the second opening 290.

In example embodiments, the gate electrode may be formed at a plurality of levels spaced apart from each other in the first direction, and the gate electrodes at the plurality of levels may form a gate electrode structure. The gate electrode structure may include at least one first gate electrode 382, a plurality of second gate electrodes 384, and at least one third gate electrode 386. The number of levels at which the first to third gate electrodes 382, 384 and 386 are formed may be changed according to the number of levels of the second sacrificial layers 170.

Figure 14:
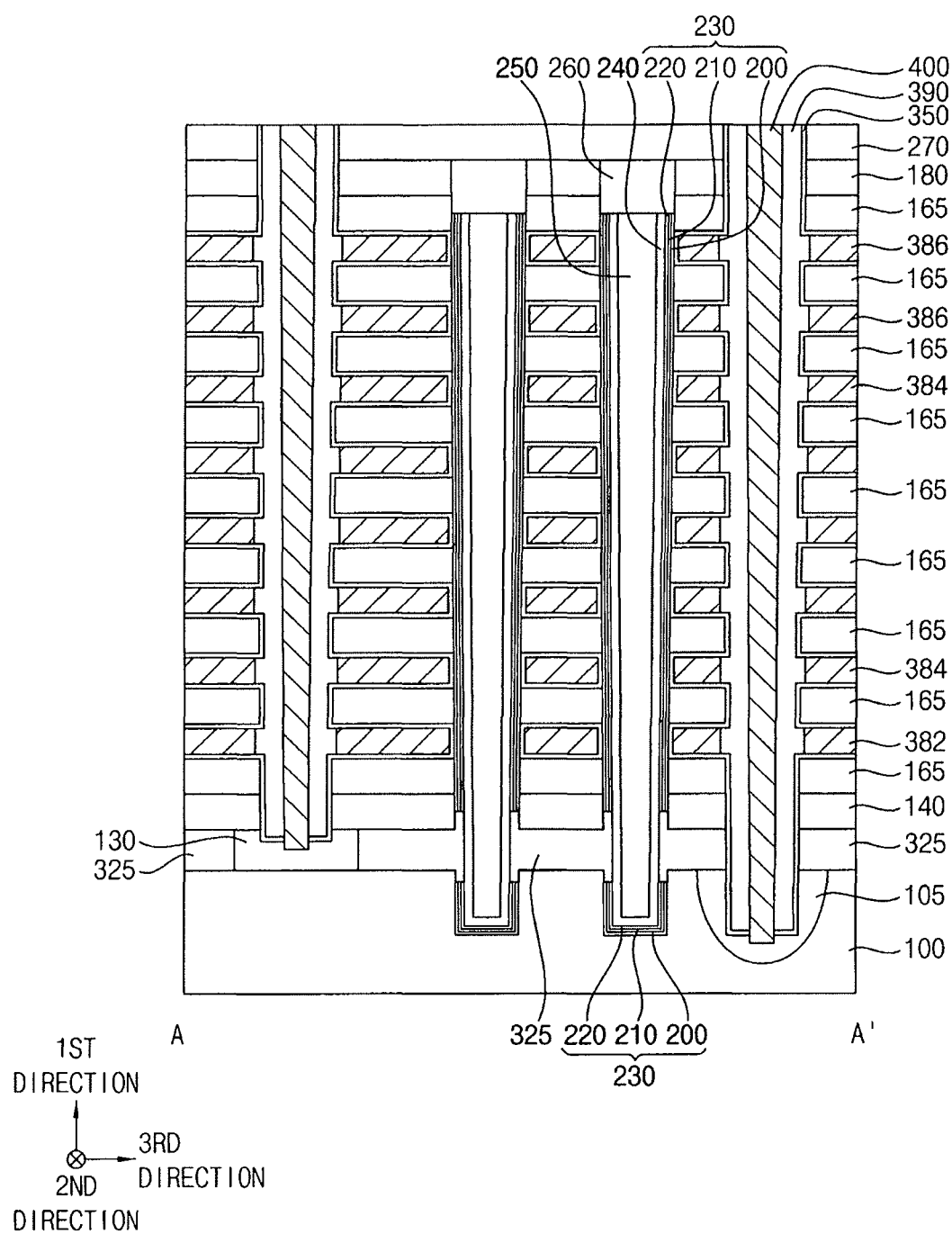

Referring to FIG. 14, a spacer layer may be formed on the second blocking pattern 350 and anisotropically etched to form a spacer 390 on the sidewall of the second opening 290. Thus, an upper surface of the second blocking pattern 350 may be partially exposed.

A portion of the second blocking pattern 350 not covered by the spacer 390 may be etched, and a portion of the second blocking pattern 350 on the upper surface of the second insulating interlayer 270 may be also etched. Additionally, upper portions of the substrate 100 and the support pattern 130 may be removed.

A conductive layer may be formed on the upper surface of the substrate 100, the upper surface of the support pattern 130, the spacer 390, and the second insulating interlayer 270 to fill a remaining portion of the second opening 290, and may be planarized until the upper surface of the second insulating interlayer 270 is exposed to form a common source line (CSL) 400. The CSL 400 may include a metal, e.g., tungsten.

In example embodiments, the CSL 400 may extend in the first direction, and also in the second direction. A lower surface of the CSL 400 may be covered by the substrate 100, i.e., the impurity region 105 and the support pattern 130. Thus, current generated by voltage applied from the CSL 400 may flow through the impurity region 105 and the channel connecting pattern 325 to the channel 240.

Figure 15:
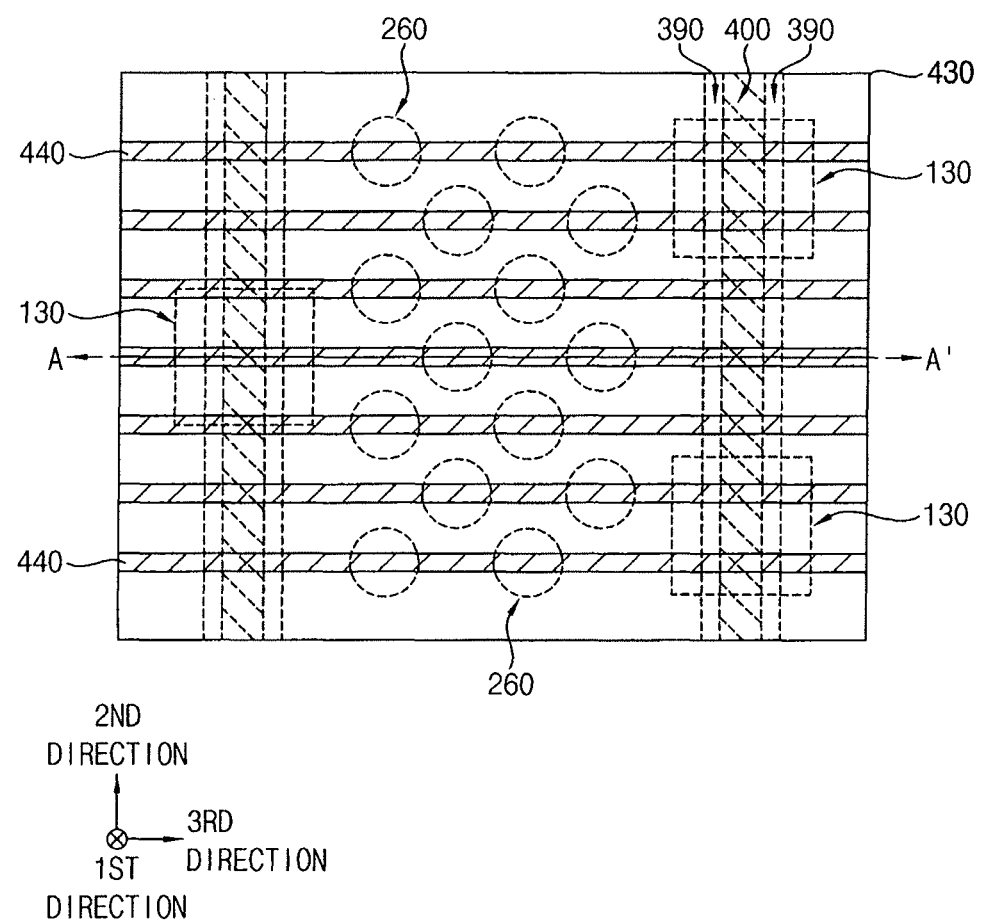
Figure 16:
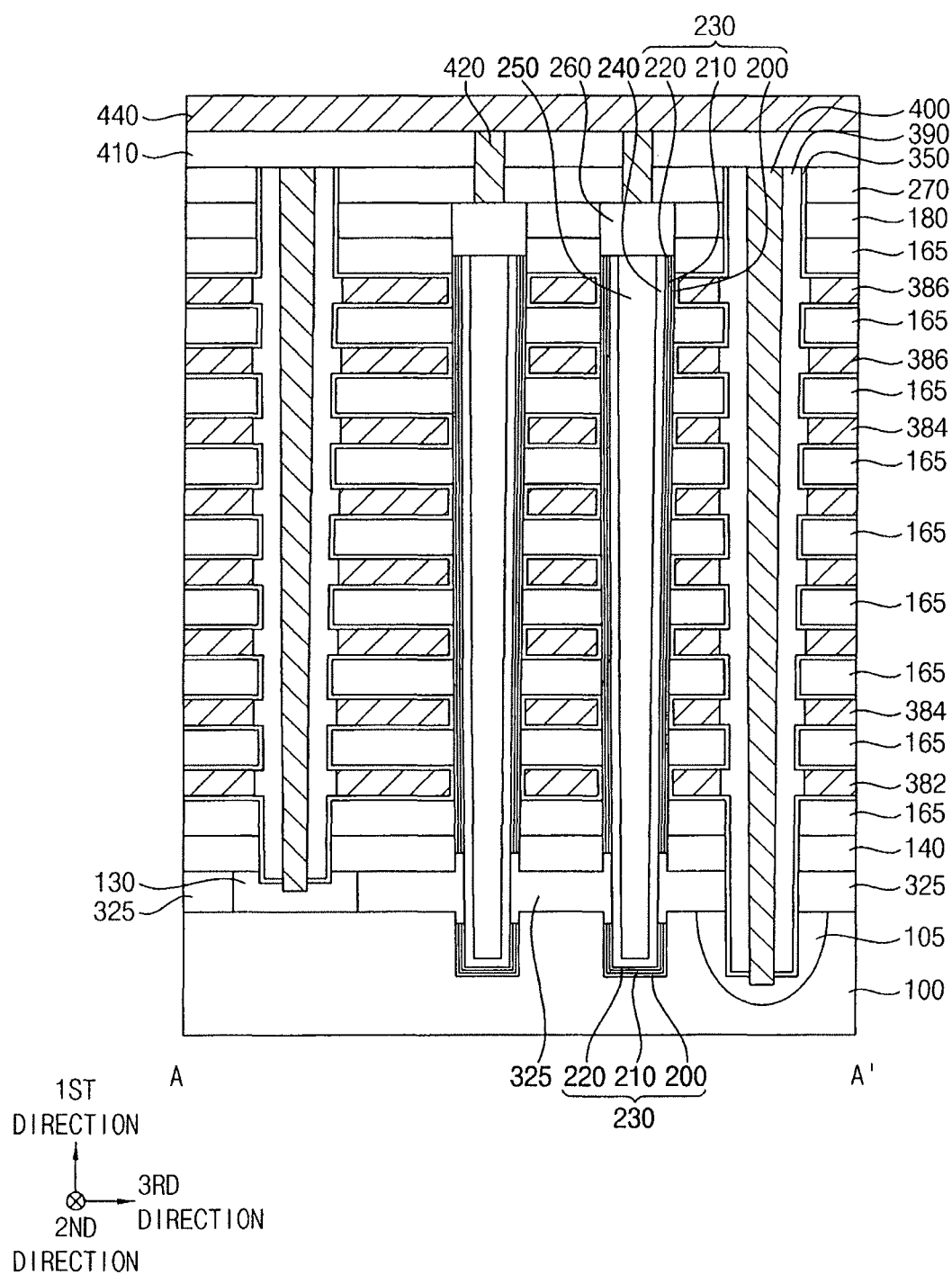

Referring to FIGS. 15 and 16, after forming a third insulating interlayer 410 on the second insulating interlayer 270, the CSL 400, the spacer 390, and the second blocking pattern 350, a contact plug 420 may be formed through the second and third insulating interlayers 270 and 410 to contact an upper surface of the capping pattern 260. A fourth insulating interlayer 430 may be formed on the third insulating interlayer 410 and the contact plug 420, and a bit line 440 may be formed through the fourth insulating interlayer 430 to contact an upper surface of the contact plug 420.

As described above, the vertical memory device may be fabricated by forming the first sacrificial layer 120 including a first insulating material on the substrate 100, forming the mold having the insulation layer 160 and the second sacrificial layer 170, including second and third insulating materials, respectively, different from the first insulating material, alternately and repeatedly stacked, forming the channel 240 through the mold and the first sacrificial layer 120, forming the second opening 290 through the mold and the first sacrificial layer 120 to expose the upper surface of the substrate 100, removing the first sacrificial layer 120 through the second opening 290 to form the first gap 310, forming the channel connecting pattern 325 to fill the first gap 310, and replacing the second sacrificial layer 170 with the gate electrode.

In example embodiments, the first sacrificial layer 120 may include a material having an etching selectivity with respect to the insulation pattern 165 and the second sacrificial pattern 175 of the mold. For example, the first sacrificial layer 120 may include germanium oxide or silicon oxide doped with germanium, which may have a high etching selectivity with respect to silicon oxide and silicon nitride included in the insulation pattern 165 and the second sacrificial pattern 175, respectively.

In example embodiments, the first sacrificial layer 120 may be removed by a wet etching process using an etching solution including SC1, which may have an etching selectivity with respect to the first sacrificial layer 120 greater than with respect to the insulation pattern 165 and the second sacrificial pattern 175. Thus, during the wet etching process, the insulation pattern 165 and the second sacrificial pattern 175 exposed by the second opening 290 may not be damaged. Accordingly, the first sacrificial layer 120 may be removed with no etch stop pattern on the sidewall of the second opening 290.

Particularly, germanium oxide ($GeO_2$) included in the first sacrificial layer 120 may have a high etching selectivity with respect to silicon oxide ($SiO_2$) included in the insulation pattern 165. The etching selectivity of the first sacrificial layer 120 including germanium oxide ($GeO_2$) with respect to silicon oxide ($SiO_2$) may be greater than that of a sacrificial layer including silicon nitride with respect to silicon oxide ($SiO_2$). Thus, the insulation pattern 165 of the mold may not be damaged during the wet etching process even with no etch stop pattern.

Additionally, the first sacrificial layer 120 may include an oxide instead of a nitride, and thus a carbon-nitrogen (C—N) residue that could have been generated if the first sacrificial layer 120 were to include a nitride may not be generated. Accordingly, the characteristics of neighboring layer structures, e.g., the channel 240 may not be degraded due to the carbon-nitrogen (C—N) residue.

In example embodiments, when the first gap 310 is formed by the wet etching process, the mold may not collapse by the support pattern 130 and the support layer 140.

FIGS. 17 to 21 are cross-sectional views illustrating stages in a method of manufacturing a vertical memory device in accordance with example embodiments. This method may include processes substantially the same as or similar to those illustrated with reference to FIGS. 1 to 16, and thus detailed descriptions thereof are omitted herein.

Figure 17:
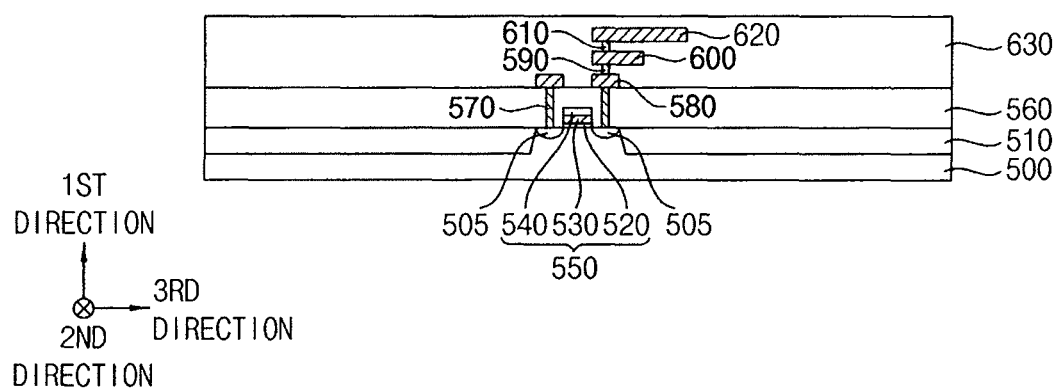
FIGS. 17 to 21 illustrate cross-sectional views of stages in a method of manufacturing a vertical memory device in accordance with example embodiments.

Referring to FIG. 17, circuit patterns may be formed on a substrate 500, and first and second lower insulating interlayers 560 and 630 may be formed on the substrate 500 to cover the circuit patterns.

The vertical memory device may have a cell over peri (COP) structure. That is, a circuit pattern region and a cell array region may be vertically stacked on the substrate 500. The substrate 500 may include a field region having an isolation pattern 510 thereon and an active region.

The circuit patterns may include transistors, lower contact plugs, lower wirings, lower vias, etc. In an example embodiment, a transistor including a lower gate structure 550 and a lower impurity region 505 at an upper portion of the active region of the substrate 500 adjacent to the lower gate structure 550 may be formed. The lower gate structure 550 may include a lower gate insulation pattern 520, a lower gate electrode 530, and a lower gate mask 540 sequentially stacked on the substrate 500.

The first lower insulating interlayer 560 may be formed on the substrate 500 to cover the transistor, and a lower contact plug 570 may extend through the first lower insulating interlayer 560 to contact the lower impurity region 505.

A first lower wiring 580 may be formed on the first lower insulating interlayer 560 to contact an upper surface of the lower contact plug 570. A first lower via 590, a second lower wiring 600, a second lower via 610, and a third lower wiring 620 may be sequentially stacked on the first lower wiring 580.

A second lower insulating interlayer 630 may be formed on the first lower insulating interlayer 560 to cover the first to third lower wirings 580, 600 and 620 and the first and second lower vias 590 and 610. The second lower insulating interlayer 630 may be merged with the first lower insulating interlayer 560.

Figure 18:
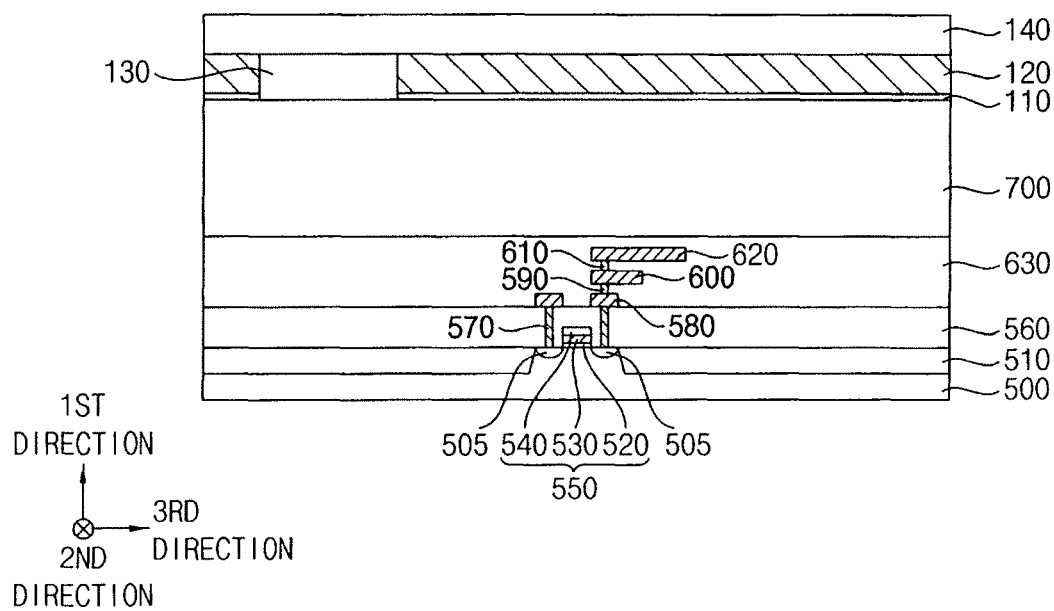

Referring to FIG. 18, a base pattern 700 may be formed on the second lower insulating interlayer 630. The base pattern 700 may be formed by forming a base layer on the second insulating interlayer 630 and patterning the base layer so as to remain on a predetermined region, e.g., on the cell array region of the substrate 500. The base pattern 700 may include a semiconductor material, e.g., polysilicon.

Processes substantially the same as or similar to those illustrated with reference to FIGS. 1 and 2 may be performed. Thus, the pad layer 110 and the first sacrificial layer 120 may be sequentially stacked on the base pattern 700, the support pattern 130 extending through the pad layer 110 and the first sacrificial layer 120 may be formed on the base pattern 700, and the support layer 140 may be formed on the first sacrificial layer 120 and the support pattern 130.

Figure 19:
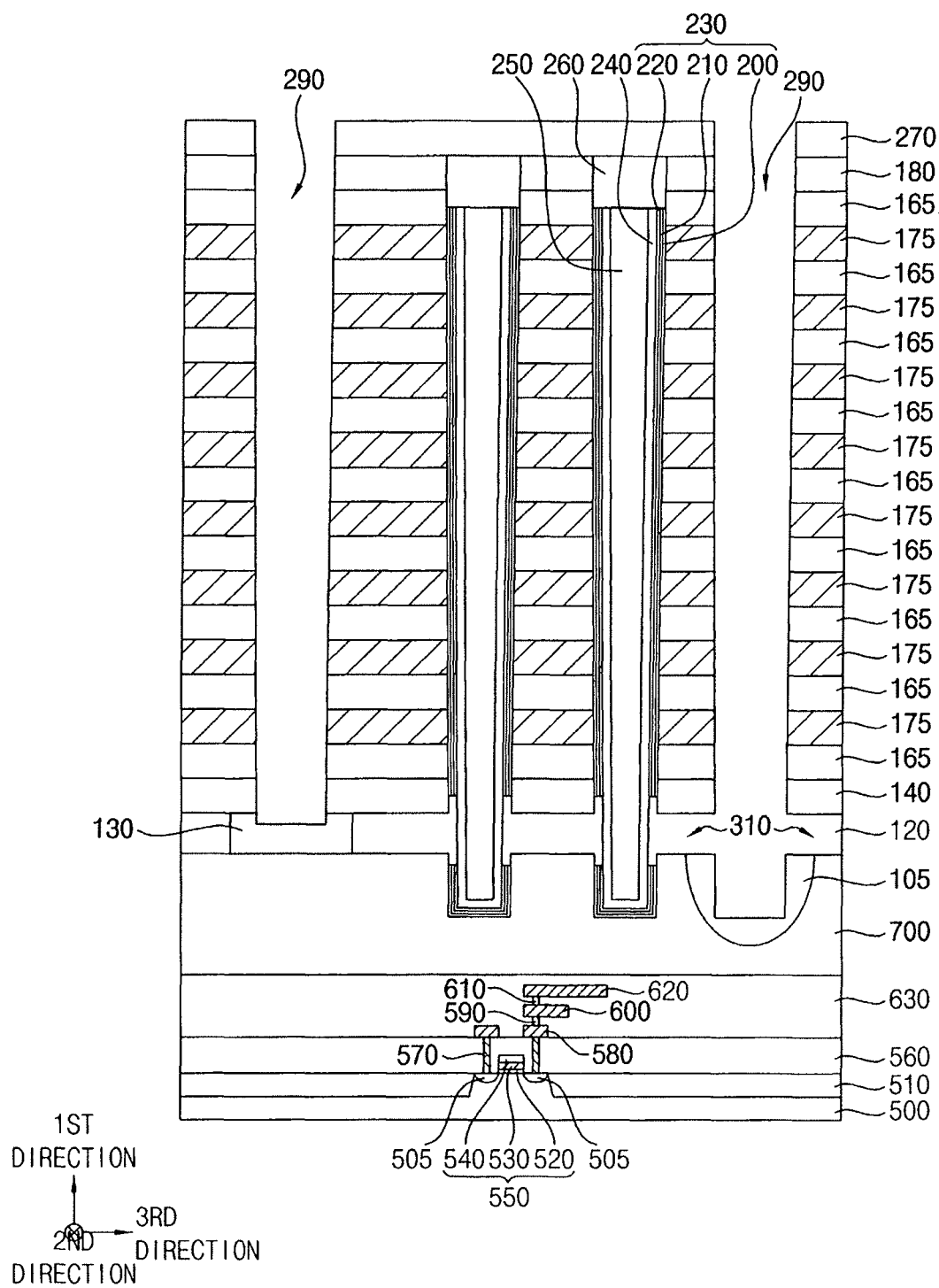

Referring to FIG. 19, processes substantially the same as or similar to those illustrated with reference to FIGS. 3 to 9 may be performed. Thus, the mold including the insulation layer 160 and the second sacrificial layer 170 sequentially stacked may be formed on the support layer 140, the channel 240 extending through the mold and the charge storage structure 230 covering a lower surface and a sidewall of the channel 240 may be formed, the second opening 290 extending through the mold, the support layer 140 and the first sacrificial layer 120 to expose an upper surface of the base pattern 700 may be formed, and the first sacrificial layer 120 and a portion of the charge storage structure 230 may be removed through the second opening 290. Additionally, the impurity region 105 may be formed at the upper portion of the base pattern 700 exposed by the second opening 290.

Figure 20:
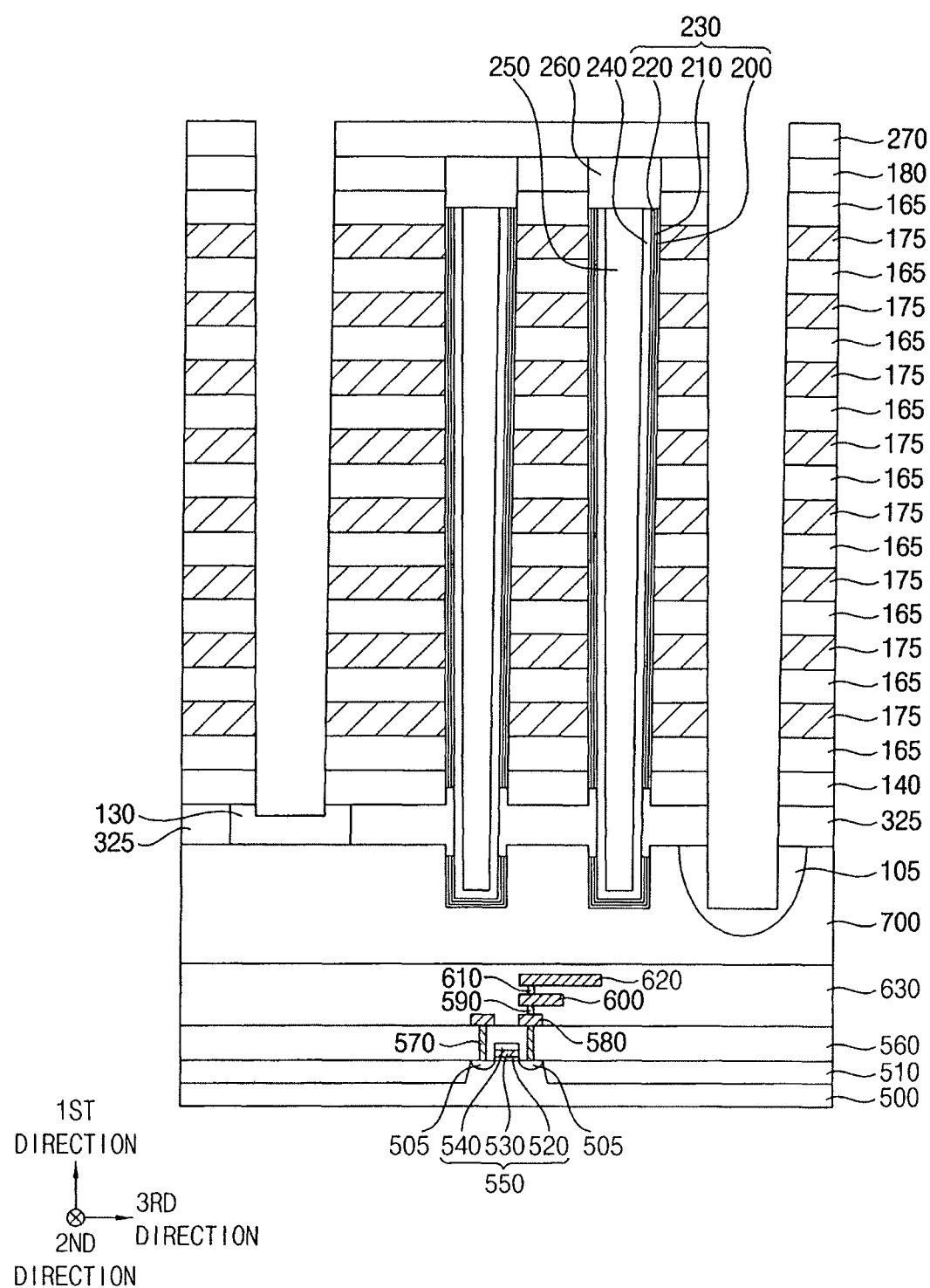

Referring to FIG. 20, processes substantially the same as or similar to those illustrated with reference to FIGS. 10 and 11 may be performed, and thus the channel connecting pattern 325 filling the first gap 310 may be formed so that the channels 240 may be connected with each other.

Figure 21:
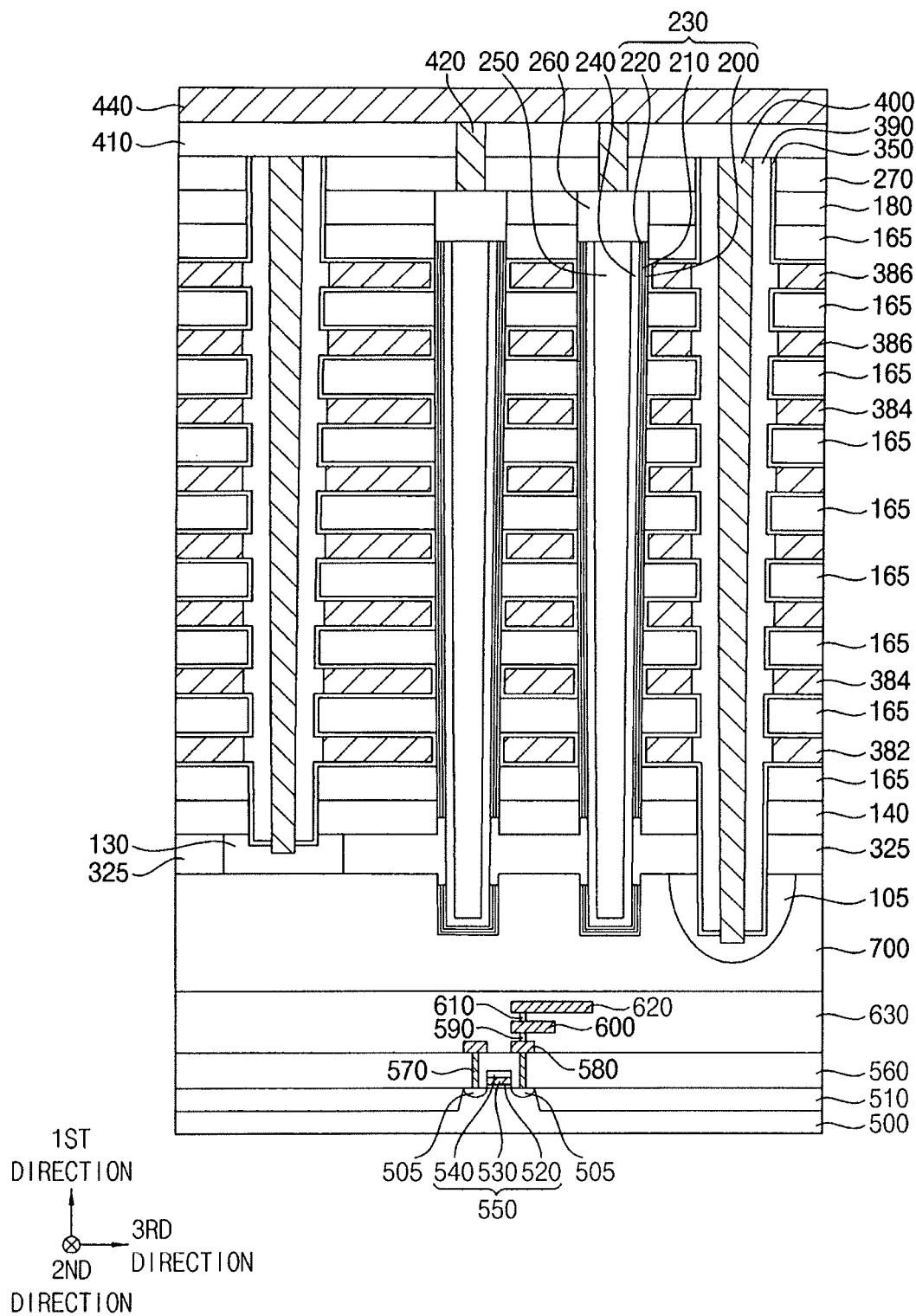

Referring to FIG. 21, processes substantially the same as or similar to those illustrated with reference to FIGS. 12 to 16 may be performed to complete the fabrication of the vertical memory device.

The vertical memory device may have a COP structure, and thus the base pattern 700 including, e.g., polysilicon, may be formed over the circuit patterns, the mold may be formed on the base pattern 700, and the channels 240 may be formed through the mold. The base pattern 700 may not include a single crystalline semiconductor material, and thus semiconductor patterns having uniform characteristics may not be formed by a SEG process using the base pattern 700 as a seed, and the channels 240 may not be uniformly connected to the base pattern 700 by the semiconductor patterns. However, in accordance with example embodiments, the channels 240 on the base pattern 700 may be connected with each other by the channel connecting pattern 325 that may be formed by removing the first sacrificial layer 120, and thus no semiconductor patterns may be formed by a SEG process.

By way of summation and review, example embodiments provide a method of manufacturing a vertical memory device having improved characteristics. That is, in a method of manufacturing a vertical memory device, when a sacrificial layer for forming a channel connecting pattern is removed through an opening extending through a mold, the sacrificial layer may include a material (e.g., germanium oxide) having a high etching selectivity with respect to other layer structures (e.g., oxide and nitride layers), so that no etch stop pattern or spacer covering the sidewall of the opening is needed. Thus, the channel connecting pattern may be formed by a reduced number of processes. Further, as the sacrificial layer does not include a nitride (e.g., includes germanium oxide), when the sacrificial layer is removed, carbon-nitrogen (C—N) residue may not be generated, so that the deterioration of characteristics of channels due to the C—N residue may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stacked structure for a vertical memory device, the stacked structure comprising:
a first structure on a substrate, the first structure including a first sacrificial layer and a support layer stacked on the substrate in a vertical direction perpendicular to an upper surface of the substrate, the first sacrificial layer including germanium; and
a second structure on the first structure, the second structure including an insulation layer and a second sacrificial layer alternately and repeatedly stacked on the first structure, the second sacrificial layer including a nitride, such that the first sacrificial layer and the second sacrificial layer include different materials from each other, wherein a thickness of the first structure in the vertical direction is less than a thickness of the second structure in the vertical direction.

2. The stacked structure as claimed in claim 1, wherein the first structure further includes a pad layer between the upper surface of the substrate and the first sacrificial layer, the pad layer including an oxide.

3. The stacked structure as claimed in claim 1, wherein the support layer includes polysilicon.

4. The stacked structure as claimed in claim 1, wherein the first structure further includes a support pattern extending through the first sacrificial layer.

5. The stacked structure as claimed in claim 4, wherein the support pattern contacts the upper surface of the substrate and a lower surface of the support layer.

6. The stacked structure as claimed in claim 4, wherein the support pattern is one of a plurality of support patterns spaced apart from each other in a horizontal direction parallel to the upper surface of the substrate.

7. The stacked structure as claimed in claim 4, wherein the support pattern includes polysilicon.

8. The stacked structure as claimed in claim 1, further comprising a channel extending through the first and second structures.

9. The stacked structure as claimed in claim 8, wherein the channel is one of a plurality of channels spaced from each other in a horizontal direction parallel to the upper surface of the substrate.

10. A stacked structure for a vertical memory device, the stacked structure comprising:
a first structure on a substrate, the first structure including a pad layer, a first sacrificial layer and a support layer sequentially stacked on the substrate in a vertical direction perpendicular to an upper surface of the substrate, the first sacrificial layer including germanium;
a second structure on the first structure, the second structure including an insulation layer and a second sacrificial layer alternately and repeatedly stacked on the first structure, the second sacrificial layer including a nitride, such that the first sacrificial layer and the second sacrificial layer include different materials from each other; and
a channel extending through the first and second structures,
wherein a thickness of the first structure in the vertical direction is less than a thickness of the second structure in the vertical direction.

11. The stacked structure as claimed in claim 10, wherein the pad layer includes an oxide and the support layer includes polysilicon.

12. The stacked structure as claimed in claim 10, wherein the first structure further includes a support pattern extending through the first sacrificial layer, the support pattern including a material the same as that of the support layer.

13. The stacked structure as claimed in claim 12, wherein the support pattern contacts the upper surface of the substrate and a lower surface of the support layer.

14. The stacked structure as claimed in claim 12, wherein the support pattern is one of a plurality of support patterns spaced apart from each other in a horizontal direction parallel to the upper surface of the substrate.

15. The stacked structure as claimed in claim 10, wherein the channel is one of a plurality of channels spaced from each other in a horizontal direction parallel to the upper surface of the substrate.

16. The stacked structure as claimed in claim 1, wherein:
the second structure is directly on the first structure, the support layer of the first structure being directly between the first sacrificial layer and the insulation layer of the second structure, and
the support layer and the insulation layer include different materials from each other.

17. The stacked structure as claimed in claim 2, wherein the first structure further includes a support pattern extending through the first sacrificial layer, a top surface of the support pattern being coplanar with a top surface of the first sacrificial layer, and a bottom surface of the support pattern being coplanar with a bottom surface of the pad layer.

18. The stacked structure as claimed in claim 4, wherein at least a portion of the support pattern is directly between the upper surface of the substrate and a lower surface of the support layer, the at least portion of the support pattern overlapping the lower surface of the support layer along a vertical direction.

* * * * *